(12) United States Patent
Kim (10) Patent No.: US 7,868,540 B2
(45) Date of Patent: Jan. 11, 2011

(54) ORGANIC LIGHT EMITTING DIODE DISPLAY DEVICE AND METHOD OF MANUFACTURING THE SAME

(75) Inventor: Eun-Ah Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 218 days.

(21) Appl. No.: 12/044,278

(22) Filed: Mar. 7, 2008

(65) Prior Publication Data

US 2008/0218066 A1    Sep. 11, 2008

(30) Foreign Application Priority Data

Mar. 8, 2007    (KR)    ............ 10-2007-0023132

(51) Int. Cl.
*H01J 1/62*    (2006.01)
*H01J 9/00*    (2006.01)
(52) U.S. Cl. ..................... 313/504; 445/24
(58) Field of Classification Search ......... 313/500–506, 313/512
See application file for complete search history.

(56) References Cited

U.S. PATENT DOCUMENTS

| 7,193,364 | B2* | 3/2007 | Klausmann et al. | ......... 313/512 |
| 2005/0162070 | A1* | 7/2005 | Park | ......................... 313/503 |
| 2005/0287686 | A1* | 12/2005 | Won | ............................ 438/22 |
| 2006/0214152 | A1* | 9/2006 | Seo et al. | ...................... 257/13 |
| 2006/0255725 | A1* | 11/2006 | Kim | .......................... 313/506 |

FOREIGN PATENT DOCUMENTS

| JP | 2000-243572 | 9/2000 |
| JP | 2003-092027 | 3/2003 |
| KR | 2004-15506 | 2/2004 |
| KR | 2006-46494 | 5/2006 |
| KR | 2006-91648 | 8/2006 |

OTHER PUBLICATIONS

Korean Office Action issued Jan. 31, 2008 in the corresponding Korean Patent Application No. 2007-23132.
Notice of Allowability issued in Korean Patent Application No. 2007-23132 on Sep. 5, 2008.

* cited by examiner

*Primary Examiner*—Joseph L Williams
*Assistant Examiner*—Brenitra M Lee
(74) *Attorney, Agent, or Firm*—Stein McEwen, LLP (57) ABSTRACT

An organic light emitting diode (OLED) display device, which can use a non-emission surface of an encapsulation substrate to reflect light, can prevent a voltage applied to a cathode from dropping, and has improved mechanical reliability, and a method of manufacturing the same. The OLED display device includes a substrate; a first electrode disposed on the substrate; an organic layer disposed on the first electrode; a second electrode disposed on the organic layer; a conductive material layer disposed on the second electrode; a metal layer disposed on the conductive material layer; an encapsulation substrate disposed on the metal layer; and an encapsulant to combine the substrate with an encapsulation substrate.

18 Claims, 6 Drawing Sheets

ORGANIC LIGHT EMITTING DIODE DISPLAY DEVICE AND METHOD OF MANUFACTURING THE SAME

CROSS-REFERENCE TO RELATED APPLICATION

This application claims the benefit of Korean Application No. 2007-23132, filed Mar. 8, 2007, filed in the Korean Intellectual Property Office, the disclosure of which is incorporated herein by reference.

BACKGROUND OF THE INVENTION

1. Field of the Invention

Aspects of the present invention relate to an organic light emitting diode (OLED) display device, and a method of manufacturing the same, and more particularly, to an OLED display device, which includes a conductive material layer and a metal layer disposed between a cathode and an encapsulation substrate, can prevent a voltage applied to a cathode from dropping, can reflect ambient light, and has improved mechanical reliability.

2. Description of the Related Art

Generally, an organic light emitting diode (OLED) display device is a self-emissive display that electrically excites organic compounds to emit light. An OLED display device may be categorized as a passive matrix OLED display device, or an active matrix OLED display device, depending on how unit pixels of an N×M matrix are driven. Compared with the passive matrix OLED display device, the active matrix OLED display device is more suitable for large-area display devices, due to its lower power consumption and higher resolution.

Figure 1:
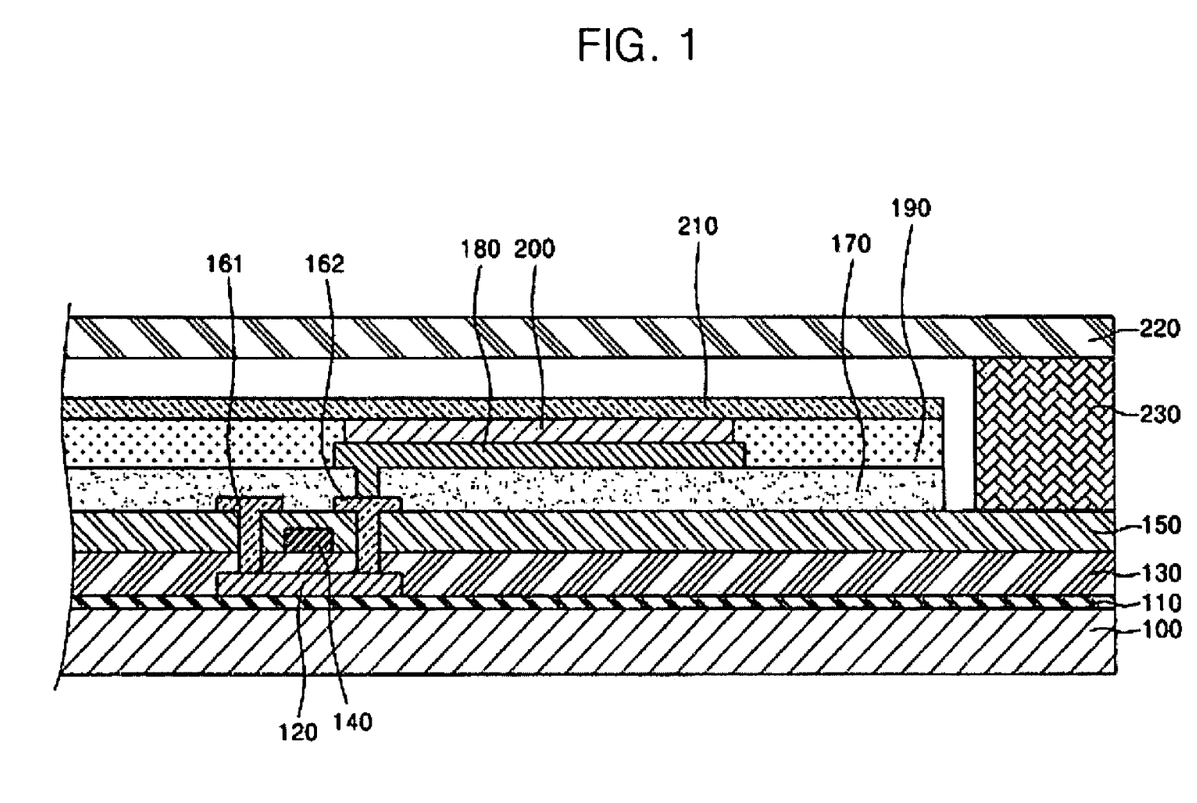
FIG. 1 is a cross-sectional view of a conventional organic light emitting diode (OLED) display device.

FIG. 1 is a cross-sectional view of a conventional OLED display device. Referring to FIG. 1, a buffer layer 110 is formed on a substrate 100, which can be an insulating glass substrate, a conductive substrate, or a plastic substrate. An amorphous silicon (a-Si) layer is formed on the buffer layer 110, and crystallized into a polysilicon (poly-Si) layer, to form a semiconductor layer 120 on the buffer layer 110.

A gate insulating layer 130 is formed on the entire surface of the substrate 100 and the semiconductor layer 120. A gate electrode 140 is formed on the gate insulating layer 130 at a predetermined region of the semiconductor layer 120. An interlayer insulating layer 150 is formed on the entire surface of the substrate 100 and the gate electrode 140, and is etched to expose predetermined regions of the semiconductor layer 120, thereby forming contact holes.

A source/drain electrode material is deposited on the entire surface of the substrate 100, and patterned to form source and drain electrodes 161 and 162. The source and drain electrodes 161 and 162 are connected to the predetermined regions of the semiconductor layer 120. A planarization layer 170 is formed on the entire surface of the substrate 100, and etched to form a hole to expose one of the source and drain electrodes 161 and 162. A first electrode 180 is formed on the planarization layer 170, and is connected to one of the source and drain electrodes 161 and 162.

Subsequently, a pixel defining layer 190 is formed to expose the first electrode 180. An organic layer 200 is formed on the first electrode 180 and the pixel defining layer 190. A second electrode 210 is formed on the entire surface of the substrate 100. The substrate 100 is combined with an encapsulation substrate 220, using an encapsulant 230.

In a conventional bottom-emitting structure, as described above, the encapsulation substrate 220 not emitting light is not used for any purpose, other than to support an absorbent.

Also, since the second electrode 210 is formed on the entire surface of the substrate 100, a voltage applied to the second electrode 210 may drop. Non-uniform voltages are applied to respective pixels, therefore, the pixels do not have uniform emission characteristics. Furthermore, when an external shock is applied to the encapsulation substrate 220, the encapsulation substrate 220 may collapse, and contact the top surface of the OLED display device, due to a gap between the substrate 100 and the encapsulation substrate 220, thereby damaging the OLED display device.

SUMMARY OF THE INVENTION

An exemplary embodiment of the present invention provides an organic light emitting diode (OLED) display device, which includes a conductive material layer and a metal layer disposed between a cathode and an encapsulation substrate, can prevent a drop in a voltage applied to a cathode, can reflect ambient light, and has improved mechanical reliability. Aspects of the present invention relate to a method of manufacturing the same.

According to one aspect of the present invention, an OLED display device includes: a substrate; a first electrode disposed on the substrate; an organic layer disposed on the first electrode; a second electrode disposed on the organic layer; a conductive material layer disposed on the second electrode; a metal layer disposed on the conductive material layer; an encapsulation substrate disposed on the metal layer; and an encapsulant to combine the substrate with the encapsulation substrate.

According to another aspect of the present invention, a method of manufacturing an OLED display device includes: providing a substrate; forming a first electrode on the substrate; forming an organic layer on the first electrode; forming a second electrode on the organic layer; forming a conductive material layer on the second electrode; forming a metal layer on a surface of an encapsulation substrate; and combining the substrate with the encapsulation substrate, using an encapsulant.

Additional aspects and/or advantages of the invention will be set forth in part in the description which follows and, in part will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings, of which.

DETAILED DESCRIPTION OF THE EXEMPLARY EMBODIMENTS

Reference will now be made in detail to the exemplary embodiments of the present invention, examples of which are illustrated in the accompanying drawings, wherein like reference numerals refer to the like elements throughout. The exemplary embodiments are described below, in order to explain the aspects of present invention, by referring to the figures.

FIGS. 2 through 5 are cross-sectional views of an organic light emitting diode (OLED) display device, according to an exemplary embodiment of the present invention. As referred to herein, when a first element is said to be "disposed" or "formed" on or adjacent to a second element, the first element can directly contact the second element, or can be separated from the second element, by one or more other elements located therebetween.

Figure 2:
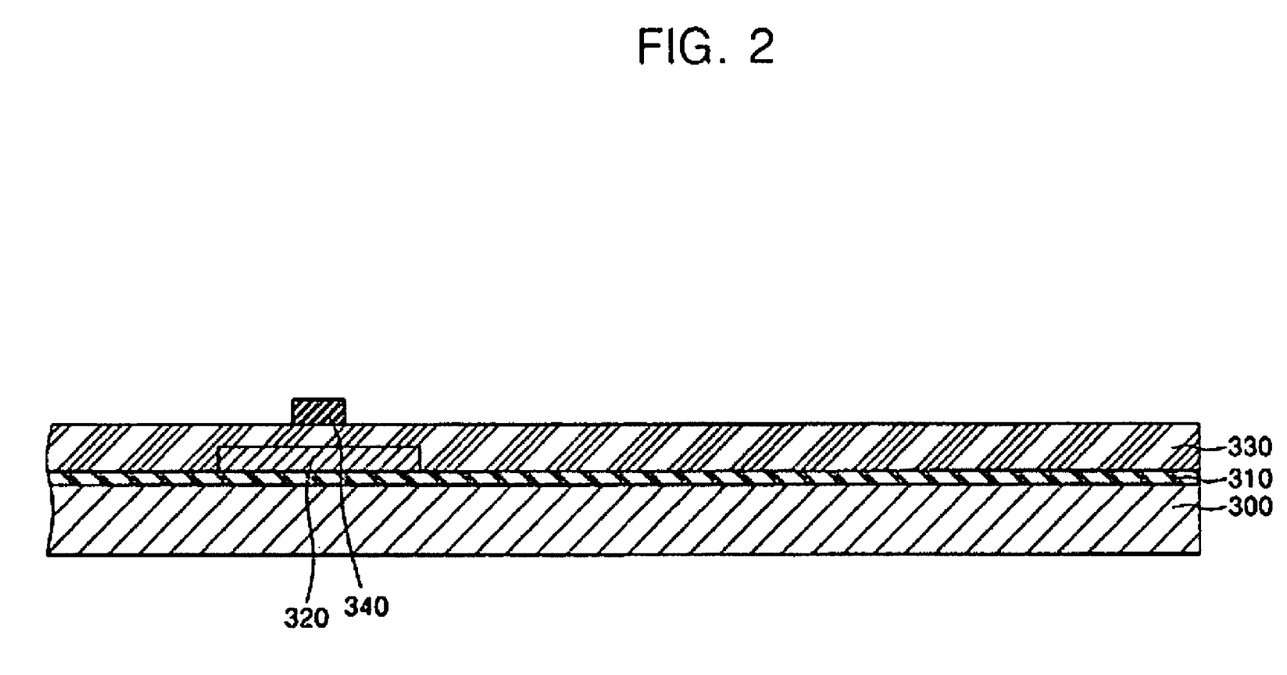
FIGS. 2 through 5 are cross-sectional views of an OLED display device, according to a first exemplary embodiment of the present invention.

Referring to FIG. 2, a substrate 300 is provided. The substrate 300 may be an insulating glass substrate, a plastic substrate, or a conductive substrate. A buffer layer 310 is formed on the substrate 300. The buffer layer 310 may be a silicon oxide layer, a silicon nitride layer, or a combination thereof. The buffer layer 310 may prevent the diffusion of impurities from the substrate 300.

A semiconductor layer 320 is formed on the buffer layer 310. The semiconductor layer 320 may be a polysilicon (poly-Si) layer that is obtained by crystallizing an amorphous silicon (a-Si) layer. The a-Si layer can be crystallized using at least one process selected from the group consisting of a rapid thermal annealing (RTA) process, a solid phase crystallization (SPC) process, an excimer laser annealing (ELA) process, a metal induced crystallization (MIC) process, a metal induced lateral crystallization (MILC) process, a super grain silicon (SGS) crystallization process, and a sequential lateral solidification (SLS) process.

A gate insulating layer 330 is formed on the entire surface of the substrate 300 and the semiconductor layer 320. The gate insulating layer 330 may be a silicon oxide layer, a silicon nitride layer, or a combination thereof.

A gate electrode material is deposited on the gate insulating layer 330, and patterned to form a gate electrode 340, at a predetermined region of the semiconductor layer 320. The gate electrode material may be one selected from the group consisting of aluminum (Al), an Al alloy, molybdenum (Mo), and a Mo alloy. For example, the gate electrode material may be an alloy of molybdenum (Mo) and tungsten (W).

Figure 3:
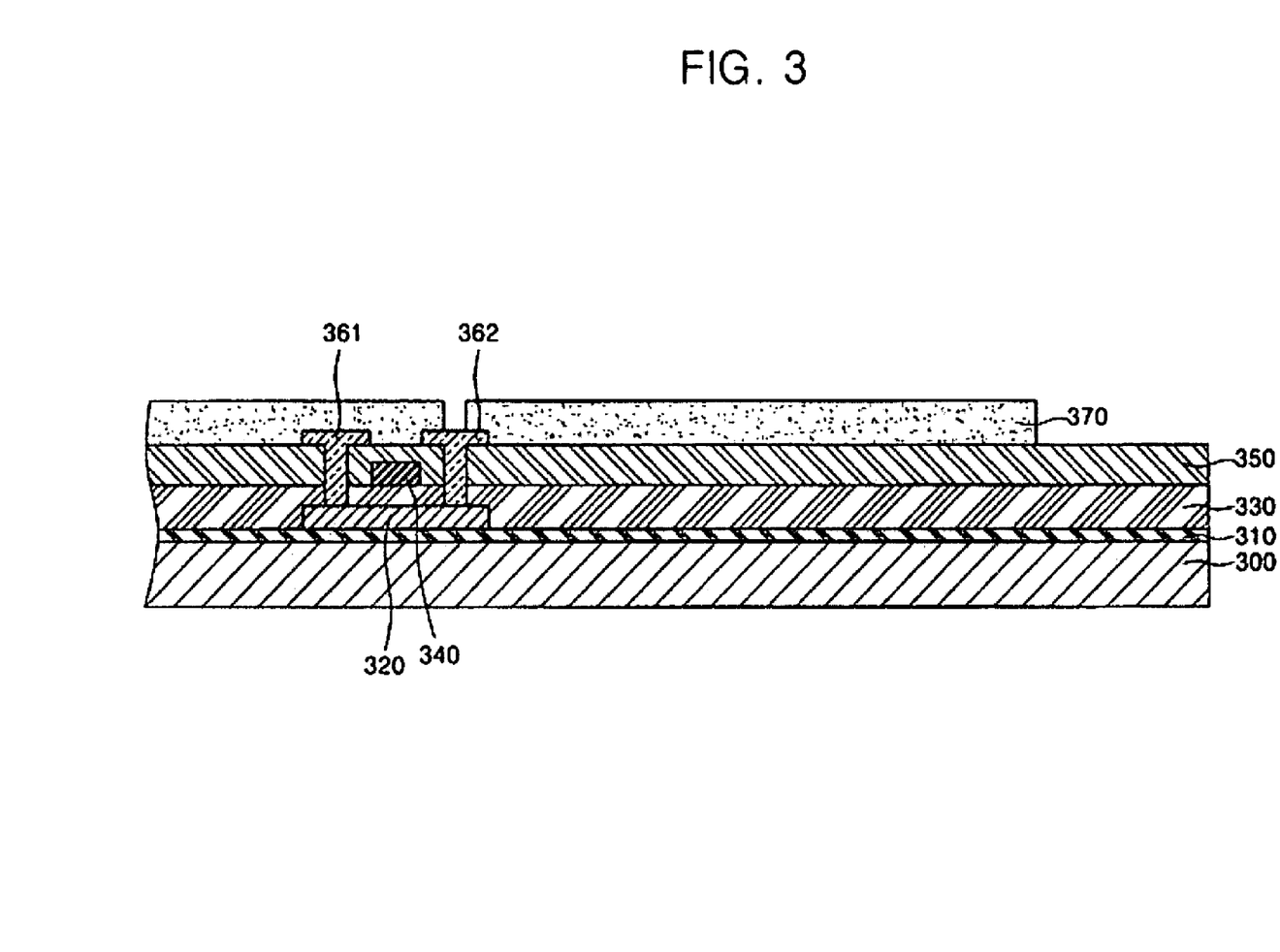

Referring to FIG. 3, an interlayer insulating layer 350 is disposed on the entire surface of the substrate 300. The interlayer insulating layer 350 may be a silicon oxide layer, a silicon nitride layer, or a combination thereof.

The gate insulating layer 330 and the interlayer insulating layer 350 are etched, to form contact holes that expose opposing end portions of the semiconductor layer 320. A source/drain electrode material is deposited on the entire surface of the substrate 300, and patterned to form source and drain electrodes 361 and 362.

The source and drain electrodes 361 and 362 may be formed from a single layer, such as, an Al layer, an Al alloy layer, a Mo layer, a Mo alloy layer, or a chrome (Cr) layer. The source and drain electrodes 361 and 362 may be formed from a composite layer, such as, an Al/MoW layer, a Ti/Al/Ti layer, or an Al/Ta layer.

A planarization layer 370 is formed on the entire surface of the substrate 300. The planarization layer 370 may be formed of one selected from the group consisting of acryl, polyimide, polyamide, and benzocyclobutene (BCB). The planarization layer 370 is then etched to form a hole that exposes one of the source and drain electrodes 361 and 362.

Figure 4:
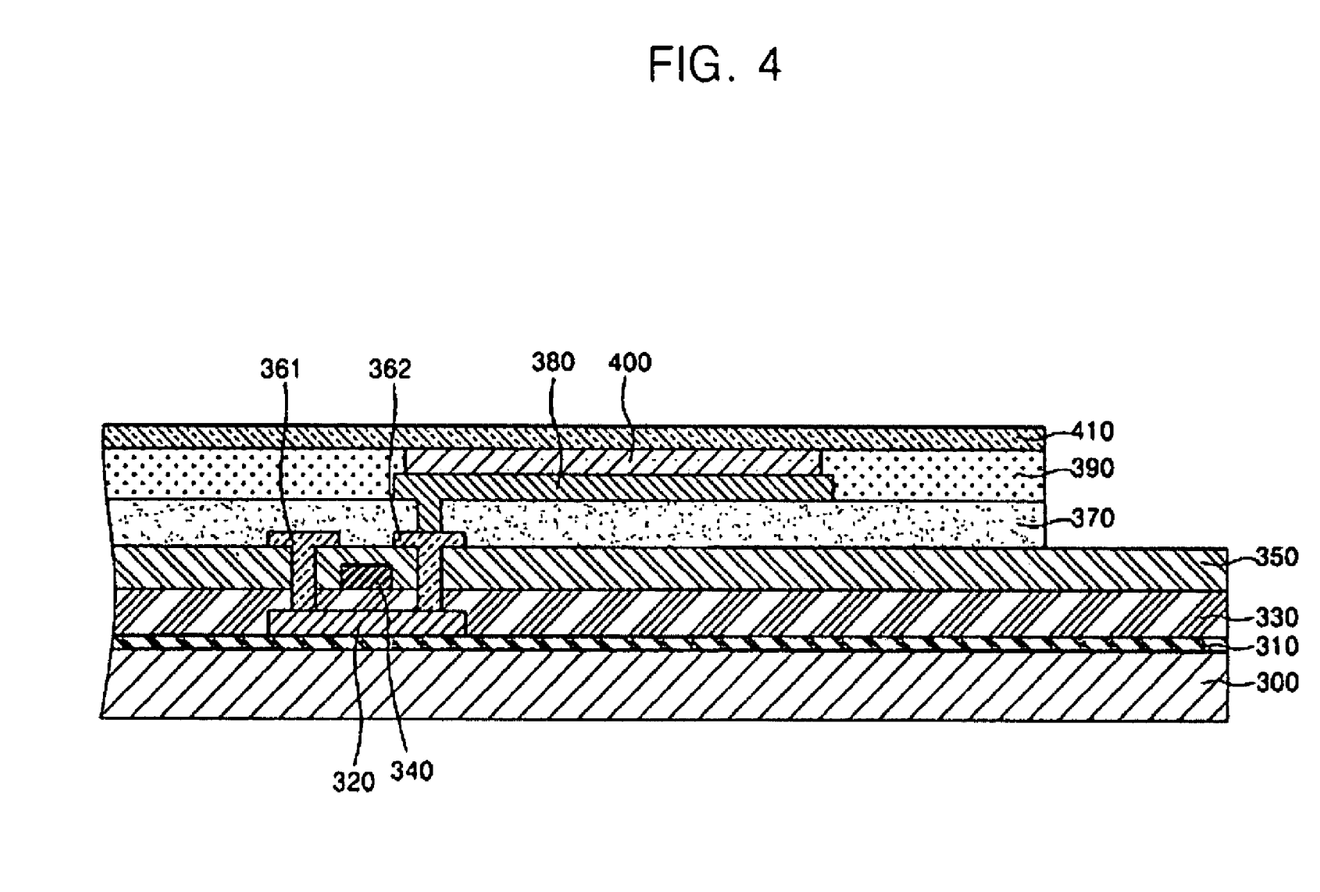

Referring to FIG. 4, a first electrode material is deposited on the entire surface of the substrate 300, and patterned to form a first electrode 380. The first electrode 380 may be an anode. The first electrode 380 may be formed of indium tin oxide (ITO), or indium zinc oxide (IZO), both of which have a high work function.

A pixel defining layer 390 is formed on the entire surface of the substrate 300. The pixel defining layer 390 may be an organic layer, or an inorganic layer. Also, the pixel defining layer 390 may be formed of one selected from the group consisting of benzocyclobutene (BCB), an acryl polymer, and polyimide. The pixel defining layer 390 may form a flat surface on the substrate 300, due having a low viscosity. The pixel defining layer 390 is etched, to form an opening to expose the first electrode 380.

An organic layer 400 is formed on the exposed first electrode 380. The organic layer 400 may include an emission layer. The organic layer 400 may further include at least one of a hole injection layer, a hole transport layer, an electron transport layer, and an electron injection layer.

A second electrode 410 is disposed on the entire surface of the substrate 300. The second electrode 410 may be a cathode. The second electrode 410 may be formed of a material having a low work function and a high reflectivity. For example, the material may be one selected from the group consisting of Al, silver (Ag), magnesium (Mg), calcium (Ca), barium (Ba), and an alloy thereof. For example, the second electrode 410 may be formed of an MgAg alloy.

Figure 5:
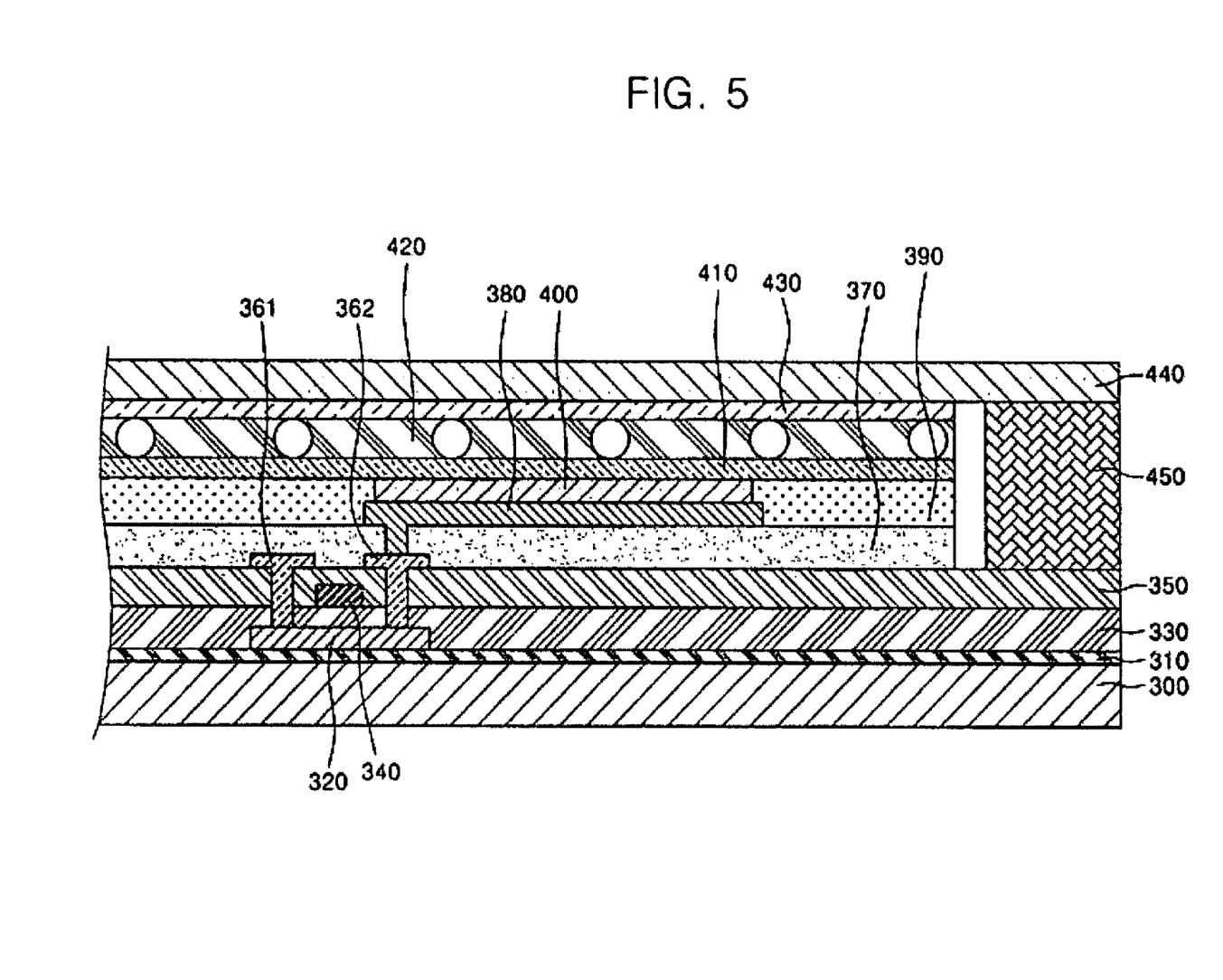

Referring to FIG. 5, a conductive material layer 420 is formed on the second electrode 410. The conductive material layer 420 may be an anisotropic conductive film (ACF). The ACF refers to an adhesive film that is formed by scattering fine conductive particles on an insulating adhesive. The conductive material layer 420 can have a thickness of 15 to 35 μm. The fine conductive particles can have an average particle size of about 3 to 15 μm. The ACF may be formed on the second electrode 410, using a lamination method.

The conductive material layer 420 may electrically connect the second electrode 410 to a metal layer 430 (to be formed later). The conductive material layer 420 may fill a gap between the substrate 300 and an encapsulation substrate 440 (to be formed later). According to some exemplary embodiments, the conductive material layer 420 may fill a gap between the encapsulation substrate 440 and the second electrode 410. Thus, even if an external shock is applied to the encapsulation substrate 440, the encapsulation substrate 440 can be prevented from sagging, so as not to damage the OLED display device. As a result, the mechanical reliability of the OLED display device can be improved.

The encapsulation substrate 440, which is formed of a transparent insulating glass, is provided. The metal layer 430 is formed on one surface of the encapsulation substrate 440. The metal layer 430 will be combined with the substrate 300, and brought into contact with the conductive material layer 420, later. The metal layer 430 may be a cathode bus line, which prevents a drop in a voltage applied to the second electrode 410. The metal layer 430 may reflect externally incident light (ambient light). The encapsulation substrate 440 and the metal layer 430 can be referred to as a mirror. Further, the metal layer 430 may reflect the light from the OLED display device. Alternatively, the encapsulation substrate 440 and the metal layer 430 can be a one way mirror that allows the light from the OLED display device to pass through, but reflects ambient light.

The metal layer 430 may be formed of a metal having excellent optical reflective characteristics. For example, the metal layer 430 may be formed of one selected from the group consisting of Al, an Al alloy, Ag, an Ag alloy, and an aluminum-neodymium (AlNd) alloy.

The metal layer 430 may be formed to a thickness of about 500 Å, or more. When the metal layer 430 has a thickness of less than about 500 Å, the metal layer 430 may not sufficiently reflect ambient light, and/or may not prevent a voltage drop from occurring at the second electrode 410 (cathode).

An encapsulant 450 is disposed at edges of one surface of the substrate 300, or on corresponding portions of the encapsulation substrate 440. The encapsulant 450 may be formed of an ultraviolet (UV)-curable material, for example, an acryl resin, or a polyimide resin.

Alternatively, the encapsulant 450 may be a glass frit, which is formed of at least one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate. In a first exemplary embodiment of the present invention, a glass frit is used as the encapsulant 450.

The substrate 300 is combined with the encapsulation substrate 440, and laser beams are radiated to the encapsulant 450, i.e., the glass frit, to fuse and solidify the glass frit. Thus, the substrate 300 can be completely adhered to the encapsulation substrate 440.

The conductive material layer 420, i.e., the ACF, is heated to a temperature of about 160 to 180° C., for 10 to 20 seconds, or a pressure of 2 to 3 MPa is applied to the ACF, to melt an adhesive of the ACF. Scattered conductive particles between the second electrode 410 and the metal layer 430 are protected, and a sufficient conductivity is obtained. Thus, the metal layer 430 is in contact with the conductive material layer 420. As a result, the second electrode 410 is electrically connected to the metal layer 430, thereby preventing a voltage drop from occurring at the second electrode 410 (cathode).

As described above, the metal layer 430 is formed on the encapsulation substrate 440, and the conductive material layer 420, i.e., the ACF, is interposed between the metal layer 430 and the second electrode 410. Thus, a voltage drop at the second electrode 410 can be prevented, one surface of the encapsulation substrate 440 can be a mirror, and damage to the device, due to external shocks, can be prevented. As a result, the mechanical reliability of the display device is improved.

The substrate 300 can be combined with the encapsulation substrate 440, using the glass frit having good encapsulation characteristics. Thus, the degradation of the device, due to an external atmosphere, can be inhibited. An emission region can be expanded, because the display device does not require an absorbent.

In the first exemplary embodiment of the present invention, the OLED display device uses the glass frit as the encapsulant 450, and does not include an absorbent. However, an OLED display device, according to a second exemplary embodiment of the present invention, may use a conventional sealant as an encapsulant, and may include an absorbent as described below.

Figure 6:
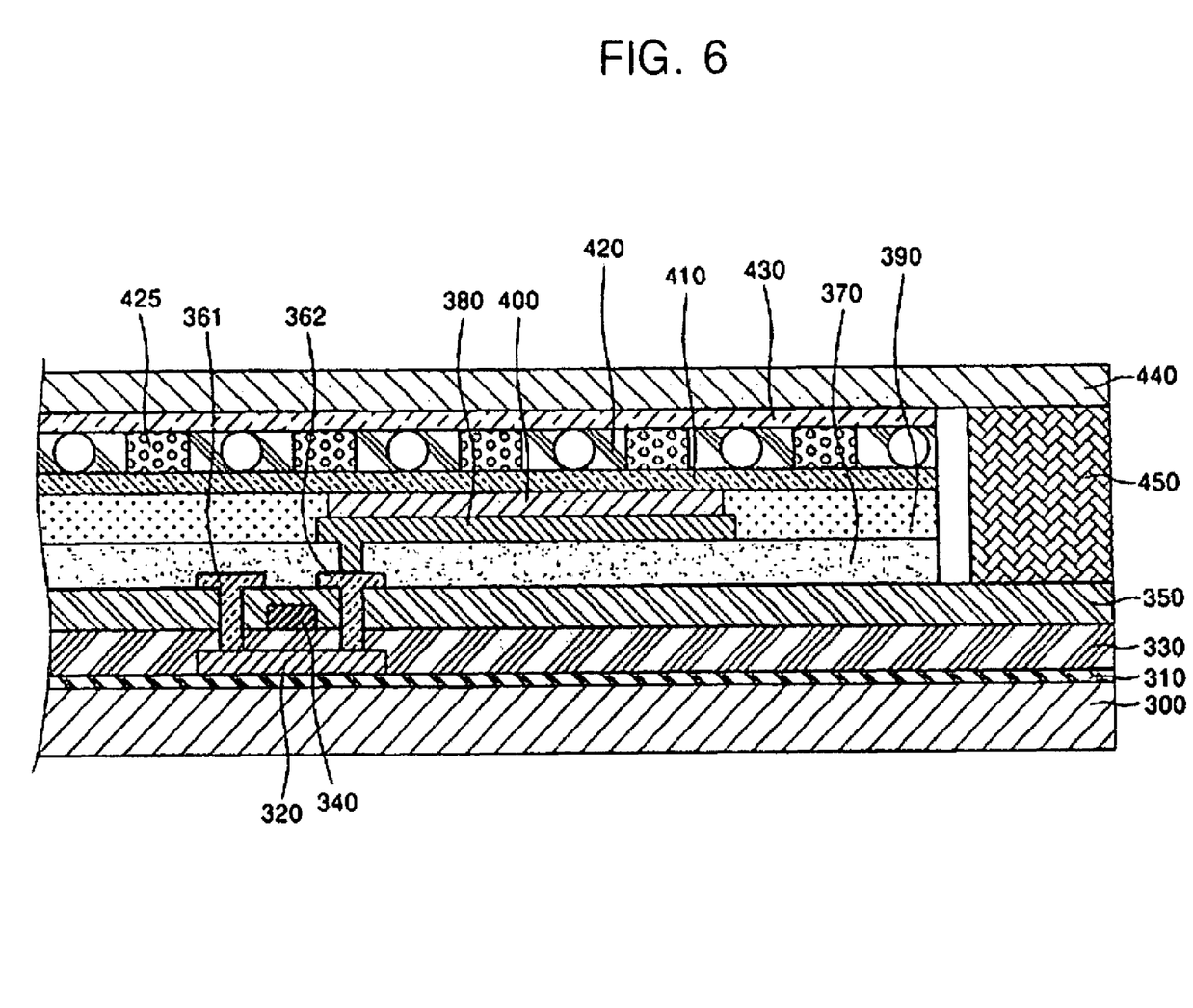
FIG. 6 is a cross-sectional view of an OLED display device, according to a second exemplary embodiment of the present invention.

FIG. 6 is a cross-sectional view of an OLED display device, according to the second exemplary embodiment of the present invention. In the second exemplary embodiment of the present invention, a thin film transistor (TFT) including a semiconductor layer, a gate electrode, and source and drain electrodes; and an organic light emitting diode including a first electrode, an organic layer, and a second electrode, are the same as in the first embodiment. Therefore, a description thereof is omitted.

Referring to FIG. 6, a conductive material layer 420 and an absorbent 425 are formed on a second electrode 410. The conductive material layer 420 may be an anisotropic conductive film (ACF). The ACF refers to an adhesive film that is formed by scattering fine conductive particles, having an average particle size of 3 to 15 μm, on an insulating adhesive having a thickness of 15 to 35 μm. The ACF may be laminated on the second electrode 410.

The absorbent 425 may be formed of at least one selected from the group consisting of barium oxide (BaO), calcium carbonate ($CaCO_3$), calcium oxide (CaO), phosphorus pentoxide ($P_2O_5$), zeolite, silica gel, and alumina. The conductive material layer 420 may electrically connect the second electrode 410 to a metal layer 430 (to be formed later). Also, the conductive material layer 420 may fill a gap between a substrate 300 and an encapsulation substrate 440 (to be formed later). Thus, even if an external shock is applied to the encapsulation substrate 440, the encapsulation substrate 440 can be prevented from sagging, so as not to damage the OLED display device. As a result, the mechanical reliability of the OLED display device is improved.

The conductive material layer 420 includes a space in which the absorbent 425 may be disposed. For example, holes are formed in the conductive material layer 420, i.e., the ACF, so that the absorbent 425 may be disposed in the holes. Thus, the absorbent 425 can inhibit external moisture, or oxygen, from permeating and degrading the OLED.

The encapsulation substrate 440, formed of transparent insulating glass, is provided. The metal layer 430 is formed on one surface of the encapsulation substrate 440. The metal layer 430 will be combined with the substrate 300, and brought into contact with the conductive material layer 420, later. The metal layer 430 may be a cathode bus line that prevents a drop in a voltage applied to the second electrode 410. The metal layer 430 may reflect externally incident light. The encapsulation substrate 440 and the metal layer 430 can be referred to as a mirror.

The metal layer 430 may be formed of a metal having excellent optical reflective characteristics. For example, the metal layer 430 may be formed of one selected from the group consisting of Al, an Al alloy, Ag, an Ag alloy, and an AlNd alloy.

The metal layer 430 may be formed to a thickness of about 500 Å, or more. When the metal layer 430 has a thickness of less that about 500 Å, the metal layer 430 may not sufficiently reflect ambient light, and/or may not prevent a voltage drop from occurring at the second electrode 410 (cathode).

An encapsulant 450 is formed on an outer portion of one surface of the substrate 300, or on a corresponding portion of the encapsulation substrate 440. The encapsulant 450 may be formed of an UV-curable material, for example, an acryl resin or a polyimide resin.

Alternatively, the encapsulant 450 may be a glass frit, which is formed of at least one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate. In the second exemplary embodiment of the present invention, it is assumed that a UV-curable material is used as the encapsulant 450.

The substrate 300 is combined with the encapsulation substrate 440, and UV beams are radiated to the encapsulant 450, to cure the encapsulant 450. Thus, the OLED display device, according to the second exemplary embodiment of the present invention, is completed.

As described above, the metal layer 430 is formed on the encapsulation substrate 440, and the conductive material layer 420, i.e., the ACF, is interposed between the metal layer 430 and the second electrode 410. Thus, a voltage drop can be prevented from occurring at the second electrode 410, one surface of the encapsulation substrate 440 can be a mirror to reflect light, and damage to the OLED display device, due to an external shock, can be prevented. As a result, the mechanical reliability of the OLED display device is improved.

When the substrate 300 is combined with the encapsulation substrate 440, using a UV-curable organic material as the encapsulant 450, the absorbent 425 is formed in the conductive material layer 420, so that the degradation of the OLED display device, due to ambient air, can be inhibited.

As described above, an OLED display device, according to the exemplary embodiments of the present invention, a non-emission surface of an encapsulation substrate can be a mirror to reflect ambient light, can prevent a voltage applied to a cathode from dropping, and has improved mechanical reliability.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode (OLED) display device, comprising:
    a substrate;
    a first electrode disposed on the substrate;
    an organic layer disposed on the first electrode;
    a second electrode disposed on the organic layer;
    a conductive material layer disposed on the second electrode;
    a metal layer disposed on and directly contacting the conductive material layer;
    an encapsulation substrate disposed on and directly contacting the metal layer; and
    an encapsulant to combine the substrate with the encapsulation substrate.

2. The OLED display device according to claim 1, wherein the substrate comprises a thin film transistor (TFT) comprising a semiconductor layer, a gate electrode, a source electrode and a drain electrode.

3. The OLED display device according to claim 1, wherein the metal layer is formed of one selected from the group consisting of Al, an Al alloy, Ag, an Ag alloy, and an AlNd alloy.

4. The OLED display device according to claim 1, wherein the second electrode is formed of one selected from the group consisting of Mg, Ca, Al, Ag, Ba, and an alloy thereof.

5. The OLED display device according to claim 1, wherein the conductive material layer is an anisotropic conductive film.

6. The OLED display device according to claim 1, wherein the metal layer is a cathode bus line.

7. The OLED display device according to claim 1, wherein the metal layer is disposed on a surface of the encapsulation substrate.

8. The OLED display device according to claim 1, wherein the encapsulant is a UV-curable material or a glass frit.

9. The OLED display device according to claim 1, further comprising an absorbent disposed between the second electrode and the metal layer.

10. The OLED display device according to claim 1, wherein the metal layer has a thickness of at least about 500 Å.

11. The OLED display device according to claim 1, wherein the metal layer prevents a voltage drop from occurring in the second electrode.

12. A method of manufacturing an organic light emitting diode (OLED) display device, comprising:
    forming a first electrode on a substrate;
    forming an organic layer on the first electrode;
    forming a second electrode on the organic layer;
    forming a conductive material layer on the second electrode;
    forming a metal layer on a surface of an encapsulation substrate; and
    combining the substrate with the encapsulation substrate, using an encapsulant, such that the metal layer on the surface of the encapsulation substrate directly contacts the conductive material layer.

13. The method according to claim 12, further comprising forming a thin film transistor (TFT) comprising a semiconductor layer, a gate electrode, and a source electrode, and a drain electrode, on the substrate.

14. The method according to claim 12, wherein the conductive material layer is formed by laminating an anisotropic conductive film.

15. The method according to claim 12, further comprising disposing an absorbent in the conductive material layer.

16. The method according to claim 12, wherein the combining of the substrate with the encapsulation substrate comprises bringing the conductive material layer into contact with the metal layer.

17. The method according to claim 12, wherein the forming of the metal layer comprises forming the metal layer to a thickness of at least about 500 Å.

18. An organic light emitting diode (OLED) display device, comprising:
    a substrate;
    a patterned first electrode and a pixel defining layer disposed on the substrate;
    an organic layer including an emission layer disposed on the patterned first electrode;
    a second electrode disposed on the organic layer and on the pixel defining layer;
    a conductive material layer disposed on the second electrode;
    a metal layer disposed on and directly contacting the conductive material layer;
    an encapsulation substrate disposed on and directly contacting the metal layer; and
    an encapsulant to combine the substrate with the encapsulation substrate.

* * * * *